(12) United States Patent
Edmond et al.

(10) Patent No.: US 8,357,923 B2
(45) Date of Patent: Jan. 22, 2013

(54) EXTERNAL EXTRACTION LIGHT EMITTING DIODE BASED UPON CRYSTALLOGRAPHIC FACETED SURFACES

(75) Inventors: John A. Edmond, Cary, NC (US); David B. Slater, Jr., Durham, NC (US); Hua Shuang Kong, Raleigh, NC (US); Matthew Donofrio, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/834,608

(22) Filed: Jul. 12, 2010

(65) Prior Publication Data

US 2010/0276700 A1    Nov. 4, 2010

Related U.S. Application Data

(63) Continuation of application No. 11/343,180, filed on Jan. 30, 2006, now Pat. No. 7,791,061, which is a continuation-in-part of application No. 10/848,937, filed on May 18, 2004, now Pat. No. 7,332,365.

(51) Int. Cl.
    *H01L 29/06* (2006.01)
(52) U.S. Cl. ............................. 257/13; 257/95; 257/98
(58) Field of Classification Search .................... 438/39, 438/40, 42, 43, 46, 47; 257/13, 79, 94, 95, 257/98, 103
    See application file for complete search history.

(56) References Cited

U.S. PATENT DOCUMENTS

| | | | |
|---|---|---|---|
| 4,865,685 A | 9/1989 | Palmour | 156/643 |
| 4,902,356 A | 2/1990 | Noguchi et al. | 148/33.4 |
| 4,912,532 A | 3/1990 | Cook et al. | 357/16 |
| 5,103,271 A | 4/1992 | Izumiya et al. | 357/17 |
| 5,376,580 A | 12/1994 | Kish et al. | 437/127 |
| 5,502,316 A | 3/1996 | Kish et al. | 257/94 |
| 5,679,152 A | 10/1997 | Tischler et al. | 117/97 |
| 5,773,369 A | 6/1998 | Hu et al. | |

(Continued)

FOREIGN PATENT DOCUMENTS

EP            0616376 A       9/1994

(Continued)

OTHER PUBLICATIONS

Dongsheng, et al, "Characteristics of the GaN Polar Surface during an Etching Process in KOH Solution," Phys. Stat. Sol (2) 180, (2000) p. 357.

(Continued)

*Primary Examiner* — Kevin M Picardat

(74) *Attorney, Agent, or Firm* — Koppel, Patrick, Heybl & Philpott

(57) ABSTRACT

A light emitting diode is disclosed that includes a support structure and a Group III nitride light emitting active structure mesa on the support structure. The mesa has its sidewalls along an indexed crystal plane of the Group III nitride. A method of forming the diode is also disclosed that includes the steps of removing a substrate from a Group III nitride light emitting structure that includes a sub-mount structure on the Group III nitride light emitting structure opposite the substrate, and thereafter etching the surface of the Group III nitride from which the substrate has been removed with an anisotropic etch to develop crystal facets on the surface in which the facets are along an index plane of the Group III nitride. The method can also include etching the light emitting structure with an anisotropic etch to form a mesa with edges along an index plane of the Group III nitride.

18 Claims, 8 Drawing Sheets

U.S. PATENT DOCUMENTS

| | | | |
|---|---|---|---|
| 5,909,458 | A | 6/1999 | Freitas et al. |
| 5,923,481 | A | 7/1999 | Skidmore et al. |
| 5,985,687 | A | 11/1999 | Bowers et al. ............... 438/46 |
| 6,071,795 | A | 6/2000 | Cheung et al. ............... 438/458 |
| 6,258,699 | B1 | 7/2001 | Chang et al. ............... 438/458 |
| 6,294,475 | B1 | 9/2001 | Schubert et al. |
| 6,303,405 | B1 | 10/2001 | Yoshida et al. ............... 438/46 |
| 6,365,429 | B1 | 4/2002 | Kneissl et al. ............... 438/46 |
| 6,420,199 | B1 | 7/2002 | Coman et al. ............... 438/22 |
| 6,420,242 | B1 | 7/2002 | Cheung et al. ............... 438/458 |
| 6,448,102 | B1 | 9/2002 | Kneissl et al. ............... 438/46 |
| 6,465,809 | B1 | 10/2002 | Furukawa et al. ............... 257/94 |
| 6,468,824 | B2 | 10/2002 | Chen et al. ............... 438/46 |
| 6,475,889 | B1 | 11/2002 | Ring ............... 438/571 |
| 6,559,075 | B1 | 5/2003 | Kelly et al. ............... 438/795 |
| 6,562,648 | B1 | 5/2003 | Wong et al. ............... 438/46 |
| 6,607,931 | B2 | 8/2003 | Streubel ............... 438/22 |
| 6,653,163 | B2 | 11/2003 | Van Hoof et al. ............... 438/47 |
| 6,657,236 | B1 | 12/2003 | Thibault et al. |
| 6,677,173 | B2 | 1/2004 | Ota ............... 438/22 |
| 6,680,495 | B2 | 1/2004 | Fitzergald ............... 438/48 |
| 6,716,654 | B2 | 4/2004 | Hsu et al. ............... 438/22 |
| 6,740,604 | B2 | 5/2004 | Kelly et al. ............... 438/795 |
| 6,740,906 | B2 | 5/2004 | Slater, Jr. et al. |
| 6,757,314 | B2 | 6/2004 | Kneissl et al. ............... 372/50 |
| 6,781,159 | B2 | 8/2004 | Romano et al. |
| 6,786,390 | B2 | 9/2004 | Yang et al. ............... 228/179.1 |
| 6,791,119 | B2 | 9/2004 | Slater, Jr. et al. |
| 6,800,500 | B2 | 10/2004 | Coman et al. ............... 438/22 |
| 6,806,112 | B1 | 10/2004 | Horng et al. ............... 438/19 |
| 6,809,341 | B2 | 10/2004 | Hsu et al. ............... 257/79 |
| 6,846,686 | B2 | 1/2005 | Saeki et al. ............... 438/22 |
| 6,847,057 | B1 | 1/2005 | Gardner et al. ............... 257/99 |
| 6,849,878 | B2 | 2/2005 | Bader et al. ............... 257/103 |
| 6,936,862 | B1 | 8/2005 | Chang et al. |
| 6,979,075 | B2 | 12/2005 | Silverbrook et al. |
| 7,042,011 | B2 * | 5/2006 | Takatani ............... 257/78 |
| 7,115,908 | B2 | 10/2006 | Watanabe et al. ............... 257/79 |
| 7,208,393 | B2 | 4/2007 | Haskell et al. ............... 438/481 |
| 7,407,872 | B2 | 8/2008 | Han et al. ............... 438/483 |
| 2001/0029086 | A1 | 10/2001 | Ogawa et al. |
| 2002/0000559 | A1 | 1/2002 | Hoof et al. |
| 2002/0063520 | A1 | 5/2002 | Yu et al. |
| 2002/0068396 | A1 | 6/2002 | Fitzergald |
| 2003/0119239 | A1 | 6/2003 | Koike et al. |
| 2003/0141506 | A1 | 7/2003 | Sano et al. |
| 2003/0173602 | A1 | 9/2003 | Hsu et al. |
| 2003/0197166 | A1 | 10/2003 | Ishida et al. |
| 2004/0041164 | A1 | 3/2004 | Thibeault et al. |
| 2004/0072382 | A1 | 4/2004 | Kelly et al. |
| 2004/0140765 | A1 | 7/2004 | Takekuma |
| 2005/0035354 | A1 | 2/2005 | Lin et al. |
| 2005/0093099 | A1 * | 5/2005 | Koike et al. ............... 257/615 |
| 2005/0221519 | A1 | 10/2005 | Leung et al. |
| 2005/0247950 | A1 | 11/2005 | Nakamura et al. |
| 2005/0269583 | A1 | 12/2005 | Kim et al. |
| 2005/0285132 | A1 | 12/2005 | Orita |
| 2006/0049411 | A1 | 3/2006 | Nakamura et al. |
| 2006/0110839 | A1 | 5/2006 | Dawson et al. |

FOREIGN PATENT DOCUMENTS

| | | |
|---|---|---|
| EP | 0795941 A | 9/1997 |
| EP | 1553640 | 7/2005 |
| JP | 61059886 | 3/1986 |
| JP | 11238913 | 8/1999 |
| WO | WO2004070844 | 8/2004 |
| WO | WO2005064666 | 7/2005 |
| WO | WO2005117152 | 12/2005 |

OTHER PUBLICATIONS

Stocker et al, "Crystallographic Wet Chemical Etching of GaN," Applied Physics Letters, vol. 73, No. 18, Nov. 2, 1998, p. 2654.

Fujii, et al, "Increase in the Extraction Efficiency of GaN-based light-emitting diodes via Surface Roughening," Applied Physics Letters, vol. 84, No. 6, Feb. 9, 2004, pp. 885-857.

Youtsey, et al, "Gallium Nitride Whiskers Formed by Selective Photoenhanced Wet Etching of Dislocations," Applied Physics Letters, vol. 73, No. 6, Aug. 10, 1998, pp. 797-799.

Transene Co., Inc., Gallium Phosphide Etchant Description, pp. 1-2, accessed Jan. 11, 2006 at http://www.transene.com/gap.html.

Gao, et al, "Roughening Hexagonal Surface Morphology on Laser Lift-Off (LLO) N-Face GaN with Simple Photo-Enhanced Chemical Wet Etching," Japanese Journal of Applied Physics, vol. 43, No. 5A, pp. L637-L639.

Office Action from related Taiwan patent application No. 096103390, dated Jan. 7, 2010.

M.K. Kelly et al, "Optical Process for Liftoff of Group III-Nitride Films" Rapid Research Note Technische Universitat Munche, Garching, Germany, (Nov. 28, 1996) pp. 1-2.

E.F. Schubert et al. "Resonant Cavity Light-Emitting Diode", AT&T Bell laboratories, Murry Hill, New Jersey, (1991), pp. 921-923.

E.F. Schubert, "Light Emitting Diodes", Cambridge University Press, (2003), pp. 198-211.

Sauerer, c. Authorized Officer; International Search Report for PCT/US2007/001531; Date of Mailing Jun. 18, 2007; 3 pages.

Office Action from U.S. Appl. No. 11/343,180, dated: Jan. 15, 2008.

Response to Office Action from U.S. Appl. No. 11/343,180, dated: Jun. 16, 2008.

Office Action from U.S. Appl. No. 11/343,180, dated: Oct. 20, 2008.

Response to Office Action from U.S. Appl. No. 11/343,180, dated: Apr. 20, 2009.

Office Action from U.S. Appl. No. 11/343,180, dated: Aug. 17, 2009.

Response to Office Action from U.S. Appl. No. 11/343,180, dated: Sep. 25, 2009.

Notice of Allowance from U.S. Appl. No. 11/343,180, dated: Dec. 30, 2009.

Amendment and Request for Continued Examination for U.S. Appl. No. 11/343,180, date: Mar. 1, 2010.

Notice of Allowance from U.S. Appl. No. 11/343,180, dated: Mar. 23, 2010.

Extended European Search Report from counterpart European Patent Application No. 08161100.6 dated Sep. 25, 2008.

Extended European Search Report from counterpart European Patent Application No. 11164342.5 dated Aug. 2, 2011.

Extended European Search Report from counterpart European Patent Application No. 11164343.3 dated Aug. 1, 2011.

EPO Form 2001, Communication Pursuant to Article 94(3)EPC in counterpart EP Patent Application No. EP 08 161 100.6 mailed Dec. 22, 2011.

T. Palacious et al. Wet Etching of GaN Grown by Molecular Beam Epitaxy on Si(111), Instituto de Sistemas Optoelectronicos y Microtecnologia and Departamento de Ingenieria Electronica, ETSI Telecommunications, Universidad Politecnia de Madrid, Semi. Sci. Technol 15 (2000) 996-1000.

Yan Gao, et al. "Roughening Hexagonal Surface Morphology on Laser Life-Off (LLO) N-Face GaN with Simple Photo-Enhanced Chemical Wet Etching", Japanese Journal of Applied Physics, vol. 43, No. 5A. 2004 pp. 637-639.

* cited by examiner

US 8,357,923 B2

EXTERNAL EXTRACTION LIGHT EMITTING DIODE BASED UPON CRYSTALLOGRAPHIC FACETED SURFACES

RELATED APPLICATIONS

This is a continuation application from Ser. No. 11/343,180 filed Jan. 30, 2006 now U.S. Pat. No. 7,791,061, entitled "External Extraction Light Emitting Diode Based Upon Crystallographic Faceted Surfaces", which is a continuation in part of application Ser. No. 10/848,937 filed May 18, 2004 now U.S. Pat. No. 7,332,365, entitled "Method for Fabricating Group-III Nitride Devices and Devices Fabricated Using Method."

BACKGROUND

The present invention relates to light emitting diodes (LEDs) formed in wide bandgap materials and in particular relates to improving the extraction of light from such LEDs.

A light emitting diode is a semiconductor photonic device that emits light upon the recombination of electrons and holes in the semiconductor material or material system. The recombination is typically driven by a voltage bias across p-type and n-type materials that form a p-n junction. Because the recombination is a quantum mechanical step, the photon generated, its energy, and thus the frequency and wavelength (perceived as color) of the photon will depend upon the maximum energy of a permitted recombination transaction.

The visible colors green, blue, and violet, along with the ultraviolet portion of the electromagnetic spectrum, represent higher frequencies and thus higher energy photons. As a result, blue light can only be produced by materials with bandgaps of at least about 2.6 electron volts (eV). In turn, because blue is a primary color and is particularly desirable for full-color devices and devices that produce white light (as a combination of red, green, and blue), much recent interest has focused upon improvements in wide bandgap light emitting diodes form from materials such as silicon carbide, diamond, and the Group III nitrides. In particular, light emitting diodes formed of Group III nitride active regions continue to gain increasing commercial acceptance and are becoming more common in everyday applications.

A number of factors taken together produce the visible emission of a light emitting diode. As a potential limiting factor, however, not every recombination-generated photon externally exits the physical diode. Stated differently, a given voltage will produce a given number of recombination events which will in turn generate a given number of photons (not necessarily the same number). Not all of the generated photons, however, will be externally emitted as visible light. Instead, the photons are subject to competing factors including reabsorption and internal reflection. Accordingly, all other factors being equal, one goal for increasing the visible output of a light emitting diode is to increase the fraction (percentage, proportion) of photons that physically escape the diode in an intended illuminating direction.

The effect of Snell's law represents another factor in the external emission of an LED; i.e., the behavior of light as it meets an interface between two different materials. Specifically, when light waves reach such an interface, they will either reflect or refract. The difference (as well as any angle of refraction) depends upon the index of refraction of the adjacent material and the incident angle of the light. In an LED, one of the adjacent materials is a semiconductor and the other is the bordering environment. In some cases this is air, while in other cases it is a lens material, frequently a polymer transparent to frequencies within the visible range. Increasing the number of different angles at which emitted photons meet the boundary correspondingly increases the statistical probability that more photons will be emitted, rather than internally reflected. Accordingly, as the electronic efficiency of Group III nitride based diodes has increased, opportunities to increase efficiency based on the boundary have become more attractive. Examples of these efforts include (but are not limited to) U.S. Pat. No. 6,791,119 and U.S. Patent Application Publication Nos. 20040041164 and 20050247950 which are commonly assigned with the present invention.

SUMMARY

In one aspect the invention is a light emitting diode that includes a support structure and a Group III nitride light emitting active structure mesa on the support structure. The mesa has its sidewalls along an indexed crystal plane of the Group III nitride.

In another aspect, the invention is a method of forming a light emitting diode with improved light extraction. In this aspect the method includes the steps of removing a substrate from a Group III nitride light emitting structure that includes a sub-mount structure on the Group III nitride light emitting structure opposite the substrate, and thereafter etching the surface of the Group III nitride from which the substrate has been removed with an anisotropic etch to develop crystal facets on the surface in which the facets are along an index plane of the Group III nitride. The method can also include etching the light emitting structure with an anisotropic etch to form a mesa with edges along an index plane of the Group III nitride.

The foregoing and other objects and advantages of the invention and the manner in which the same are accomplished will become clearer based on the followed detailed description taken in conjunction with the accompanying drawings.

DETAILED DESCRIPTION

Figure 1:
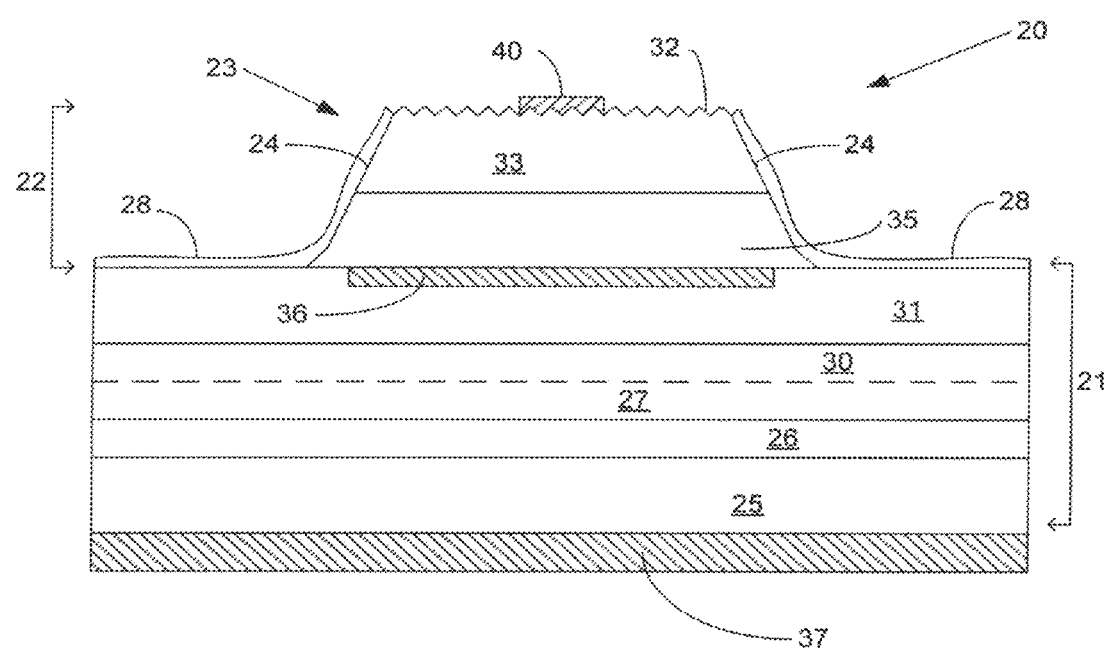
FIG. 1 is a cross-sectional schematic view of one embodiment of a light emitting diode according to the present invention.

FIG. 1 is a schematic cross-sectional illustration of a light emitting diode 20 according to the present invention. It will be understood that FIG. 1 illustrates the specific aspects of the invention, that those of ordinary skill in this art will understand these in context, and that a wide variety of other details about LEDs could be discussed, but are omitted from FIG. 1 for the sake of clarity.

In a broad sense, the light emitting diode 20 includes a support structure which in FIG. 1 is indicated by the bracketing arrows 21 and a Group III nitride light emitting active structure similarly designated by the bracketing arrows 22 on the support structure 21. The active structure forms a mesa broadly designated at 23. The mesa 23 has its sidewalls 24 along an indexed crystal plane of the Group III nitride that forms the active structure.

The term "indexed crystal plane" is used in its well understood sense consistent with the law of rational indexes; i.e. for any crystal species there is a set of axes in terms of which all naturally occurring faces have reciprocal intercepts proportional to small integers. These integers are typically referred to in the format "(hkl)" or (hkil) for hexagonal crystals (including gallium nitride). In describing a crystal plane, the set of integers chosen should be the simplest set of many possible choices and the simplest set is referred to as the Miller indexes of a crystal face. Planes that occur or develop naturally in crystals have a high surface density of lattice sites and these lattice sites are repeated regularly throughout three dimensions in a manner well understood in crystal science and terminology.

Those familiar with crystal structures will recognize, of course, that any crystal plane (face) can be described using the Miller Index system. Thus, a crystal face that is created by a mechanical process such as sawing the crystal or etching it in a plasma will have an appropriate set of (hkl) or (hkil) indexes that properly describes the plane. Nevertheless, such mechanically created planes are rarely referred to as indexed crystal planes, and are not referred to as such herein, because they do not represent reciprocal intercepts proportional to small integers. Instead, such planes represent intercepts that may be proportional to large integers ("17, 13, 7") that are unrelated to the naturally occurring faces of the particular crystal. As used herein, the minus sign ("–") is used in place of the "bar" convention to indicate an intercept on the negative axis.

Figure 17:
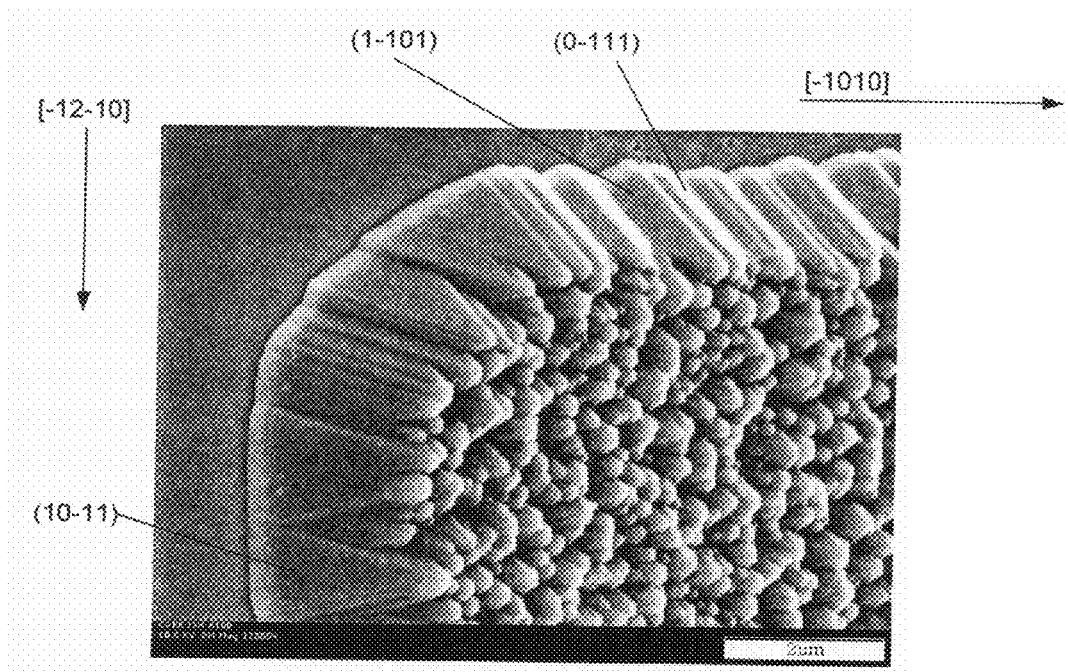

In order to distinguish the indexed crystal planes of the invention, they are also referred to herein with the adjective phrase, "chemically developed," to represent that the faces have been produced using the wet chemical etch. The nature of the wet etch produces naturally occurring indexed crystal planes rather than planes that are uncharacteristic of the naturally occurring crystal. For example, the photograph included herein as FIG. 17 illustrates mesa sidewalls that fall within the {10-11} family of planes in hexagonal GaN, and FIG. 17 specifically illustrates the (10-11), (1-101) and (0-111) planes along with the [−12-10] and [−1010] directions. In accordance with the present invention the angle(s) relative to the support structure is determined by the indexed plane(s) obtained. The angle can be varied depending on the orientations of the growth substrate, the orientation of the mesa relative to the growth substrate (for example the rotation of the mesa in the growth plane) and/or the etching process. In the embodiment of FIG. 17 where the mesa is made of GaN grown on a SiC substrate on the (0001) plane, the mesa sidewalls are at about 58° on one side and about 62° on an adjacent side. The angles can be made more or less symmetric and the asymmetry can be increased by changing one or more of the parameters mentioned above. In this manner, other angles (e.g. greater than 42° can be achieved. Those of skill in the art will recognize that mesas of cubic GaN, or other materials with other crystal symmetry will demonstrate similar characteristics, but at other angles. Other crystal facet angles (mesa or sidewall) can be achieved with other materials or other crystal structures. In general, the mesa sidewalls form along indexed crystal planes of the mesa material, and in the illustrated embodiment, the sidewalls form an angle of between about 58 and 62 degrees with respect to the support structure.

In terms of characteristics, a chemically developed face is predominantly formed by a chemical reaction (as opposed to a partial or secondary reaction) between the etching composition and the gallium nitride. Thus, potassium hydroxide wet etching forms a chemically developed face. A "reverse CVD" process in which the gallium nitride was chemically etched by an appropriate gas may also form a chemically developed face. These chemically developed faces are naturally smooth on an atomic scale.

By comparison, chemically developed faces do not include those produced by sawing or by plasma etching even though some chemical reaction may occur between the plasma etch composition and the underlying crystal. Furthermore, dry (plasma) etching does not generate naturally occurring index faces. Dry etching also unfavorably induces damage in gallium nitride. Some of the damage physically absorbs light, while other damage causes point defects that affect the electronic characteristics of the crystal and thus of the resulting device.

In exemplary embodiments, the support structure 21 is either formed of a plurality of conductive layers or includes a conductive path so that when the diode 20 is mounted, for example on a lead frame, it will have a vertical orientation; i.e., the current that drives the diode will flow axially through the diode rather than laterally. In many circumstances, a vertical diode offers advantages over a "horizontal" diode in that a vertical diode generally presents a smaller footprint than a horizontal one with the same emitting area. In an exemplary embodiment, the support structure 21 can include a plurality of elements. These can include (as illustrated) a substrate 25, barrier layer 26 and 31, and metal bonding layers 27 and 30. Such sub-mount structures are described in detail in commonly assigned U.S. Pat. No. 6,740,906, the contents of which are incorporated entirely herein by reference.

These plurality of layers are exemplary of diodes that are prepared and mounted in what is referred to as "flip-chip" orientation. Although the invention is described herein in the flip-chip context, the invention is not limited to the flip-chip orientation.

In the embodiment illustrated in FIG. 1, an emitting face 32 of the diode 20 is a Group III nitride surface of the active structure 22. This is in comparison to some current devices in which a transparent material such as silicon carbide or sapphire forms a light emitting surface of the diode.

The illustrated light emitting structure 22 is formed of a top (terminating) layer of n-type type gallium nitride 33 with the nitrogen face exposed and a p-type layer of gallium nitride 35. The opposite conductivity layers 33 and 35 form a p-n junction for recombination purposes.

It will be understood that the light emitting structure can include a larger number of elements; for example, additional and/or intervening layers for various purposes including structures such as multiple quantum wells or superlattice structures. Because both these more complex structures and the more basic structure illustrated in FIG. 1 can be used in accordance with the present invention, these other structures will not be discussed in detail. Other etchants could be developed for the gallium face, non-polar or semi-polar faces.

It will also be understood that although FIG. 1 is described in terms of gallium nitride (GaN), the structure is consistent with ternary and quaternary Group III nitrides; e.g. AlGaN, InGaN, and AlInGaN. With respect to the features of the invention, these material systems are well-understood.

As set forth in previously-referenced U.S. Pat. No. 6,740,906 the support structure 21 is typically selected from the group consisting of metals, semiconductors, and combinations of metals and semiconductors.

In the exemplary embodiment illustrated in FIG. 1, the gallium nitride layers 33 and 35 terminate in the indexed crystal plane sidewalls 24 of the mesa 23. The mesa sidewalls fall along the (hkil) crystal plane of gallium nitride based upon the manner in which the diode is manufactured as discussed further herein.

FIG. 1 also illustrates a mirror 36 positioned adjacent the light emitting structure 22 but opposite the emitting surface 32 to enhance light extraction from the diode 20.

FIG. 1 also illustrates that in exemplary embodiments the light emitting surface 32 of the diode 20 is similarly crystallographic; i.e., formed of a plurality of crystal features that demonstrate indexed planes of the Group III nitride. In particular, as shown in FIG. 1, the crystal planes of the crystallographic surface 32 correspond (i.e., are congruent in the geometric sense) to the crystal planes of the mesa sidewalls 24, for example when they are formed using the same or similar etchant and/or process. As will be observed with respect to FIGS. 13 and 17 (discussed later herein), one of the crystal planes appears to be dominant, but other planes appear as well.

The light emitting diode 20 also includes an ohmic contact 37 to the support structure 21 and an ohmic contact 40 to the active structure 22. In some embodiments, the ohmic contact 40 is made to the crystallographic textured surface 32 (e.g., FIG. 1) while in other embodiments a planar surface (not shown) is provided for the contact 40. Forming the ohmic contact 40 on a roughened surface, such as the crystallographic textured surface 32, may provide an improved physical and electrical connection between the contact 40 and the active structure 22. A passivation layer 28 is typically included to provide both electrical isolation and environmental protection. The passivation layer is typically formed of silicon dioxide, stoichiometric silicon nitride, nonstoichiometric silicon nitride, or combinations thereof.

Because of their small size (LED chips of this type are typically about 200-1000 microns along one side), in exemplary manufacturing techniques, diodes such as the illustrated diode 20 are formed as a plurality of mesa structures on a common wafer rather than individually.

Figure 2:
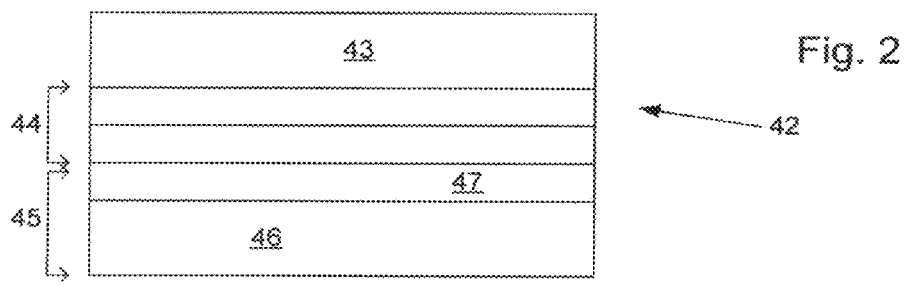
FIGS. 2 through 7 are cross-sectional schematic views illustrating certain method aspects of the present invention.

In another aspect, the invention comprises the method of forming a light emitting diode with improved light extraction characteristics. In this aspect, the invention is illustrated by FIGS. 2 through 7. FIG. 2 illustrates a precursor structure 42 formed of a semiconductor substrate 43, a light emitting active structure 44, and a sub-mount structure 45 which is illustrated as having two elements 46 and 47 with 47 representing a bonding metal.

Figure 3:
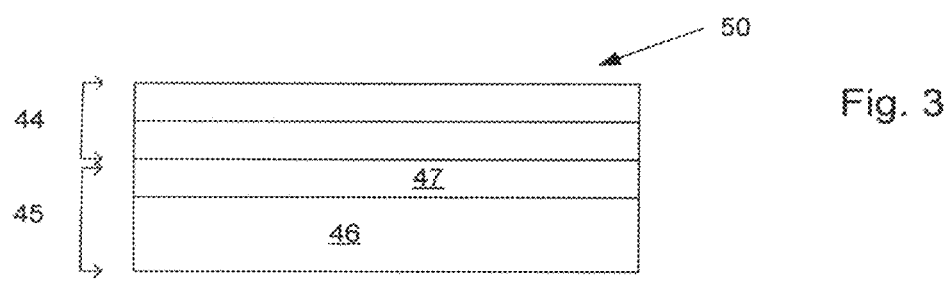

In the method, the substrate 43—which in exemplary embodiments is silicon carbide because of the advantages it provides for supporting GaN gallium nitride or other Group III nitride layers—is removed to form the further precursor structure 50 illustrated in FIG. 3 (which contains the same elements as FIG. 2 except for the substrate 43). An exemplary technique for removing the SiC substrate is set forth in previously-incorporated Publication No. 20050247950. Other substrates can be used such as sapphire, AlN, Si or other substrates suitable for Group III nitride growth.

Figure 4:
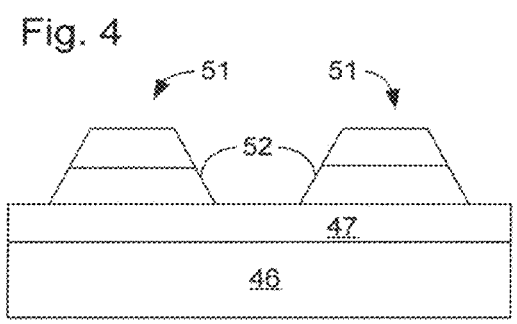
Figure 5:
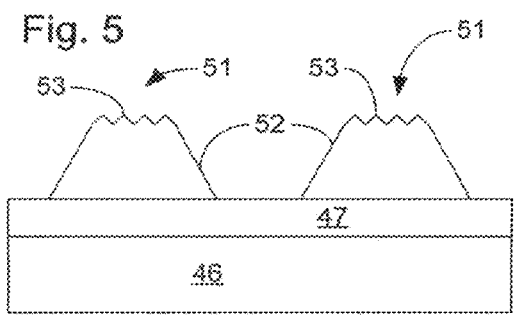
Figure 6:
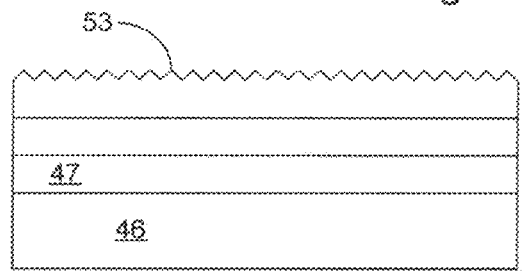
Figure 7:
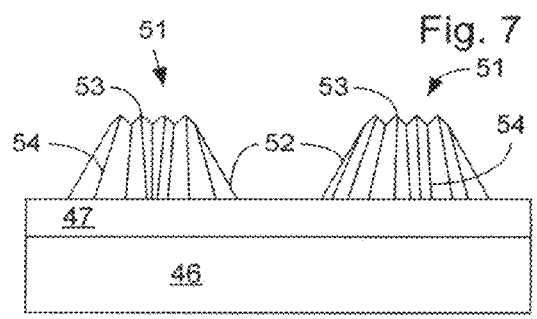

FIGS. 4-7 represent the next two method steps, but with the steps illustrated in FIGS. 4 and 5 taken in opposite order from those of FIGS. 6 and 7 to form slightly different embodiments of the finished structure. In the progression from FIG. 3 to FIG. 4, the method comprises etching (with masking) the light emitting structure 44 with an anisotropic etch to form at least one, and typically a plurality of, mesas 51 with their edges 52 along an index plane of the Group III nitride of the active structure 44 in a manner the same as just described with respect to FIG. 1.

Thereafter, in the progression between FIG. 4 and FIG. 5, the surface of the Group III nitride active portion 44 is also etched with an anisotropic etch to develop crystal facets on the respective surfaces 53 in which the facets are along an index plane of the Group III nitride. Because the mesas 51 in FIG. 5 were etched prior to the surface etch, they have indexed sidewalls but predominantly without individual faceted features. In certain embodiments, a passivation layer 28 (FIG. 1) can be put on the sidewalls 52 and/or the top surface of the mesa 51. Subsequently portions of the passivation layer can be removed from the top surface to permit the selective formation of the featured surface 53. The passivation layer can be SiN or any other suitable material that is otherwise compatible with the structure and operation of the diode and that does not otherwise interfere with any of the remaining method steps. In this embodiment, the passivation layer acts as a mask to define the portion of the top surface that includes the features 53. The mask can be opened as desired using otherwise conventional photolithography techniques; i.e. a wet or dry fluoride-based etch for removing SiN.

In the complementary progression from FIG. 3 to FIGS. 6 and then 7, the surface of the emitting (active) portion 44 is etched first with the anisotropic etch to develop the crystal facets in the surface 53. Then, progressing from FIG. 6 to FIG. 7, the masking and etching of the mesas is carried out to produce a slightly different, yet complementary, structure. In particular, in the resulting structure illustrated in FIG. 7, the mesas include the index plane sidewalls 52 and the faceted surface 53, but the sidewalls 52 are also additionally faceted as indicated by the multiple lines 54. The sidewall facets 54 result from the surface 53 having been faceted in the first step—before etching the mesas—rather than the second. Using the complementary steps, the mesas in FIG. 7 have index plane mesa sidewalls 52 that include the plurality of individual index plane facets 54. As both FIGS. 5 and 7 illustrate, in exemplary embodiments a plurality of mesas are formed on a common wafer.

Both of the etching steps, i.e. for the surface and for the mesas, are carried out with an anisotropic wet etch typically selected from the group consisting of potassium hydroxide (KOH), sodium hydroxide (NaOH), potassium hexacyanoferrate ($K_2[Fe(CN)_6]$), and combinations thereof. Other processes for forming the features of the invention are possible. A KOH solution of between about 0.01 and 0.04 molar (M) will etch at an appropriate rate to form either the mesas or the faceted emitting surface or both. In a photochemical electrical ("PEC") technique, the GaN (or other Group III nitride) is illuminated with ultraviolet light (e.g., 5-10 mW/cm$^2$ at 365 nanometers) to enhance the etch rate.

When the same etchant is used for both etches (surface and mesa), the mesa sidewalls will carry the same (i.e., geometrically congruent) index planes as the surface facets. As used herein, the term "same index plane" refers to a plane with the same indexes and not the identical plane in space.

In particular, the etching conditions will establish a family of planes {hkil} rather than a single plane (hkil). In particular, the potassium hydroxide etch may, and probably will, create several families of planes, but these will be consistent based on the use of the particular etching composition (KOH) on the particular crystal (GaN). As a comparative example, in silicon technology particular etchants can be purchased that will chemically develop selected desired planes. It is expected that the same may be true with respect to Group III nitrides. but this has not yet been established. It has, however, been observed that the concentration and temperature of the potassium hydroxide tend to make very little difference in the families of planes obtained.

As is generally understood in this art, potassium hydroxide is an anisotropic etchant with respect to many semiconductor materials. It will accordingly favorably etch materials such as gallium nitride to form a specific crystal face because it etches at a significantly different rate with respect to different crystal planes; see e.g., U.S. Pat. Nos. 5,909,458 at column 3 lines 51-56 and Nos. 5,923,481 at column 3 lines 12-25.

In the present invention the potassium hydroxide tends to form a face along the (hkl) plane of gallium nitride. Additionally, and is also understood in the art, KOH produces the favored crystal face over a relatively wide range of etching times and conditions.

As an empirical observation, the KOH etch appears to create a predominant family of {hkil} faces, but also secondary families of faces having different {hkil} indices.

In comparison, conventional processes form the mesas, using a mechanical or dry etching (i.e., plasma) process that produces a mesa sidewall that is not necessarily along an indexed crystal plane, but rather is the product of the structure-defining technique. These processes typically produce a nominally vertical sidewall mesa for device isolation or junction delineation.

The method of the invention instead provides a means for isolating individual junctions and devices and separating them from one another by the anisotropic etch so that the layers that form the light emitting active structure terminate in the same indexed edge as the rest of the mesa.

If desired for complementing purposes, the method can also include a step of dry etching at least a portion of the mesa sidewalls, and this can be carried out either before anisotropicly etching the sidewalls or after anisotropicly etching the sidewalls.

Figure 8:
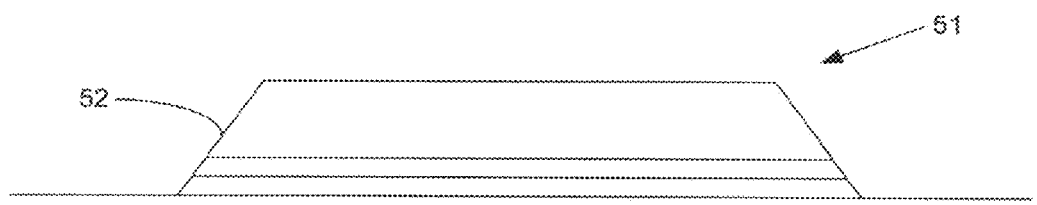
FIGS. 8, 9 and 10 are schematic illustrations of certain structural aspects of the invention.
Figure 9:
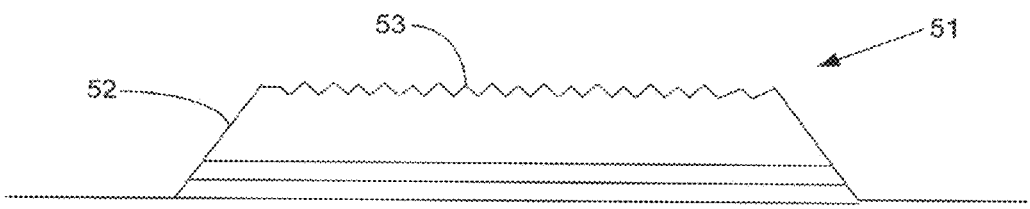
Figure 10:
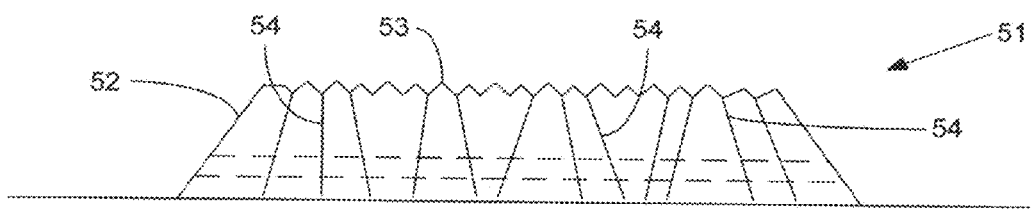

FIGS. 8, 9, and 10 summarize the three potential results. FIG. 8 shows the mesa 51 with the index plane side edges 52. FIG. 9 shows the mesa 51 with the indexed side edges 52 and the crystal faceted top surface 53. FIG. 10 illustrates the mesa 51 with the crystal faceted emitting surface 53, the index plane sidewalls 52 and the facets 54 on the sidewall 52.

FIGS. 11 through 17 are photographs of selected portions of diodes according to the present invention and illustrating actual examples of the characteristics of the method and resulting structures.

Figure 11:
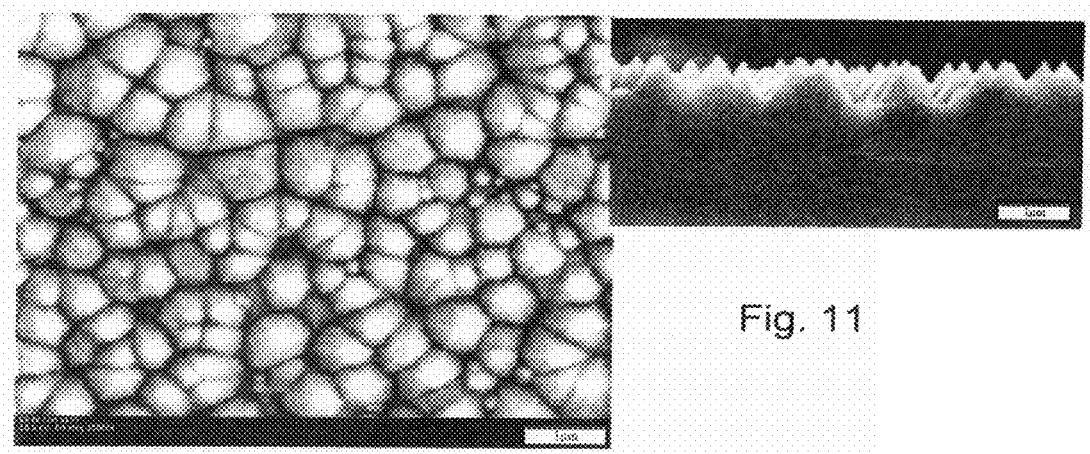
FIGS. 11 through 17 are photographs of diodes and portions of diodes that incorporate aspects of the present invention.
Figure 12:
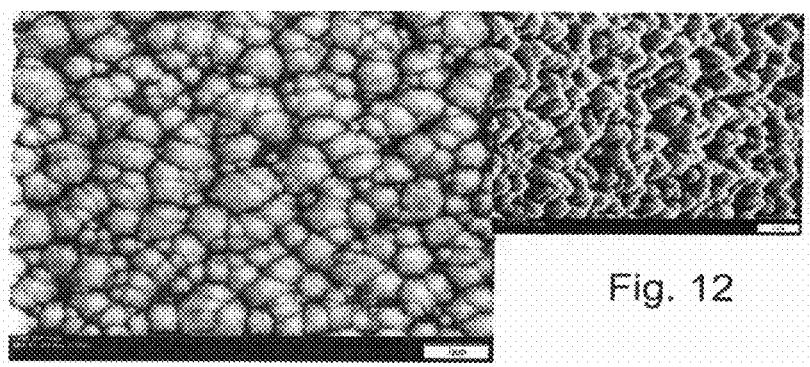

FIGS. 11 and 12 are composite photographs in which the larger photograph is a top plan view of the crystal faceted surface of the diode (e.g. item 53 in FIGS. 5, 7, and 8-10) and the insets are cross-sectional or prospective views of the same surfaces. In particular, the inset photographs highlight the crystal index plane orientation of the surface.

Figure 13:
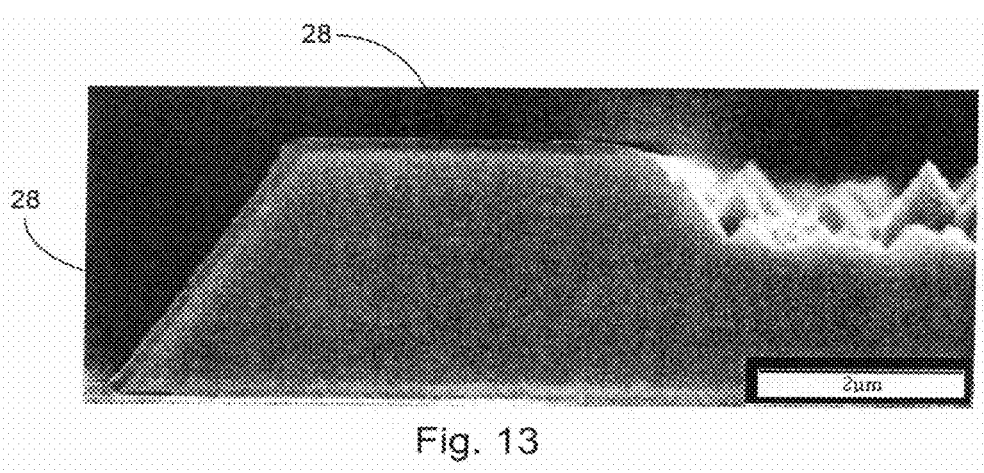

FIG. 13 illustrates a portion of a mesa in which the angles of the features on the crystal surface are congruent with the angle of the mesa sidewall. FIG. 13 also shows the passivation layer 28. In this embodiment, the passivation layer 28 remains on the sidewalls and around the periphery of the top surface of the mesa thereby confining the faceted surface.

Figure 14:
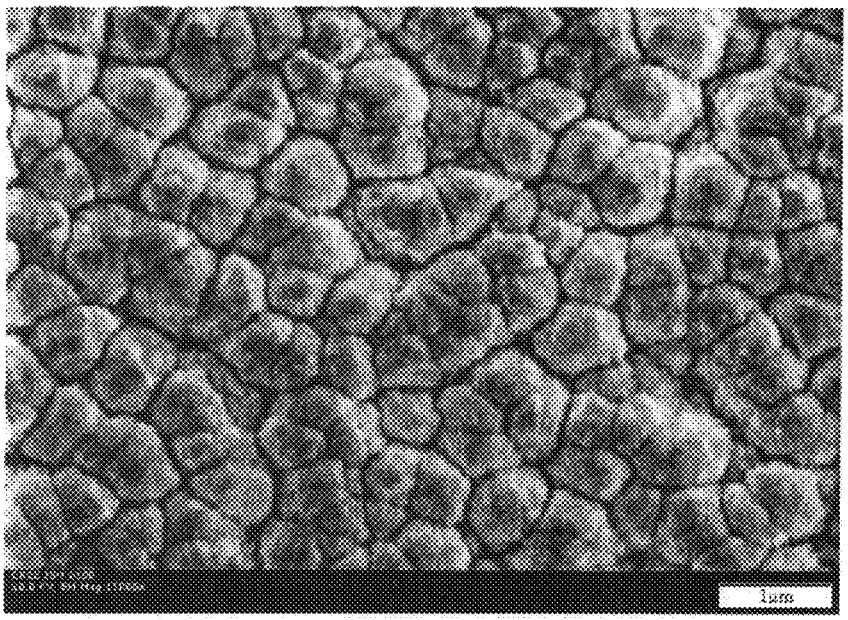
Figure 15:
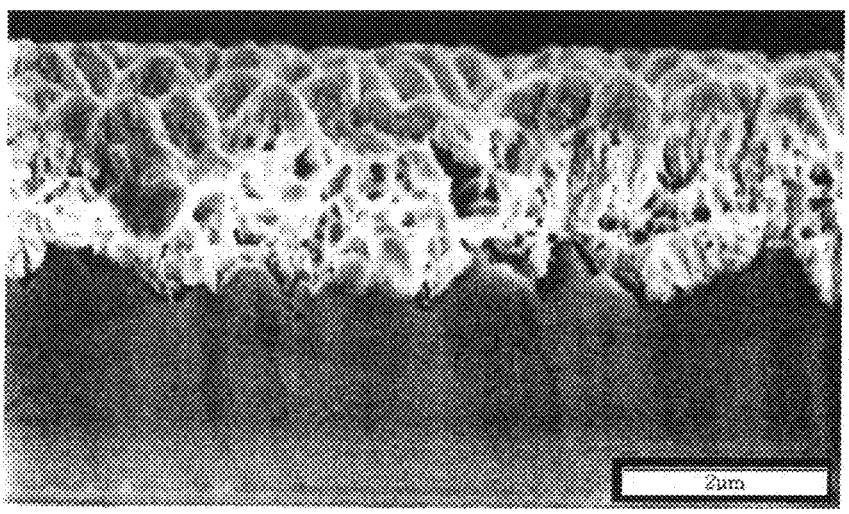

FIG. 14 is a top plan view of the surface ohmic contact and FIG. 15 is a cross-sectional view of the surface contact as made to the crystal faceted surface.

Figure 16:
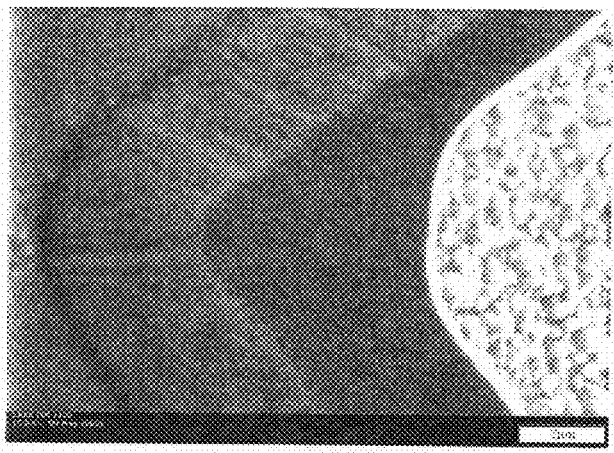

FIG. 16 illustrates a corner of a mesa that has been developed (etched) before the surface is developed to produce resulting sidewalls that follow the crystal plane, but that are not predominantly faceted.

FIG. 17 illustrates a similar corner of a mesa in which the crystal surface is developed before the mesa so that when the mesa is developed, it exhibits the faceted sidewalls. FIGS. 16 and 17 illustrate that the sidewall angle on one side of the mesa can differ from the sidewall angle on an adjacent side of the mesa.

Because the faceted structures according to the invention are developed naturally in the wet etching process, the invention avoids the need for more complex methods of forming or obtaining lenticular surfaces or other techniques that attempt to increase light extraction.

Figure 18:
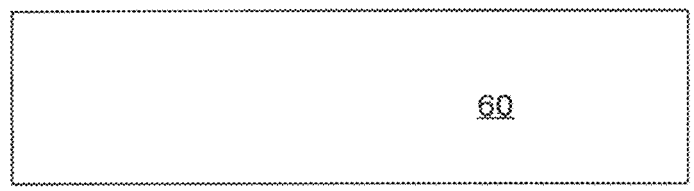
FIGS. 18 through 20 are schematic views illustrating certain aspects of the present invention.
Figure 19:
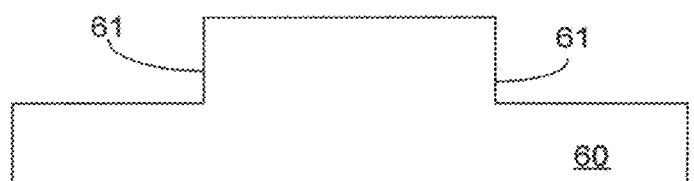
Figure 20:
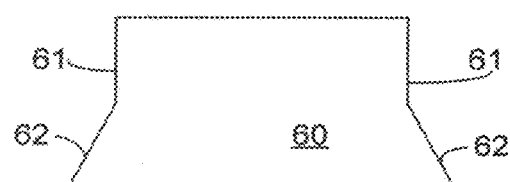

FIGS. 18, 19 and 20 schematically illustrate the mesa shape that can be developed when two etches are used successively, with dry or plasma anisotropic etch (e.g. a reactive ion etch) preceding a chemical etch. FIG. 18 schematically illustrates the cross-section of a gallium nitride layer 60 which, when etched anisotropicly in a plasma produces sidewalls 61 that are vertical or near vertical (FIG. 19), but do not represent an index crystal plane in the sense used herein. When the gallium nitride crystal 60 is then etched in the wet chemical etch, it produces a second set of naturally occurring faces 62 as illustrated in FIG. 20.

Figure 21:
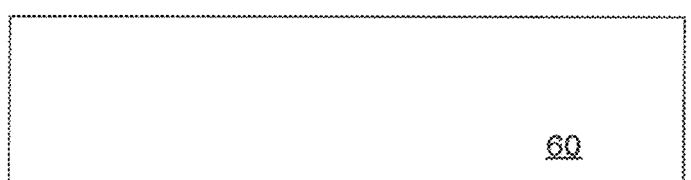
FIGS. 21 through 23 are schematic views illustrating certain aspects of the present invention.
Figure 22:
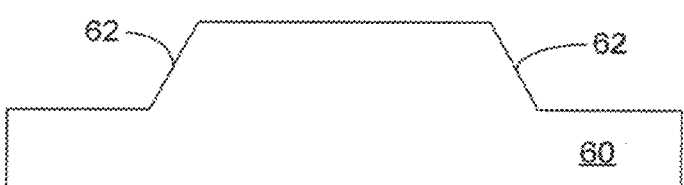
Figure 23:
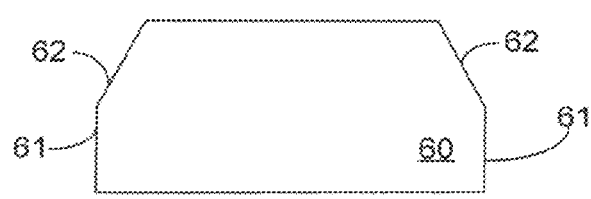

FIGS. 21, 22 and 23 schematically illustrate the resulting shape that is developed when the wet etch precedes the dry or plasma etch. Thus, in FIG. 21 the gallium nitride layer 60 is first chemically developed to form the index faces 62 and then, in the progression from FIG. 22 to FIG. 23, plasma etched to produce the more vertical sidewalls 61 in a position opposite of their appearance in FIG. 20.

Figure 24:
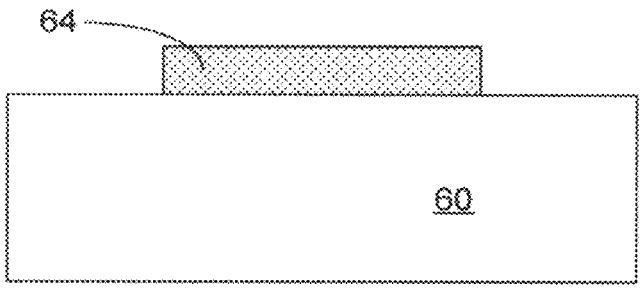
FIGS. 24 through 27 are schematic views illustrating certain aspects of the present invention.
Figure 25:
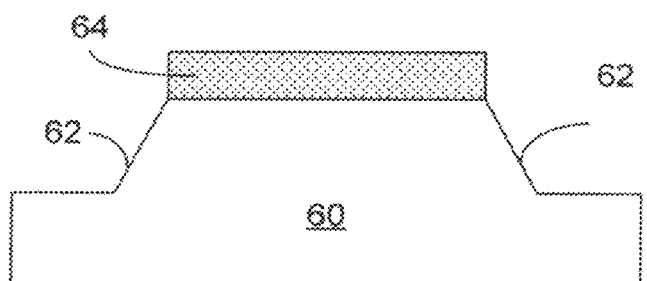
Figure 26:
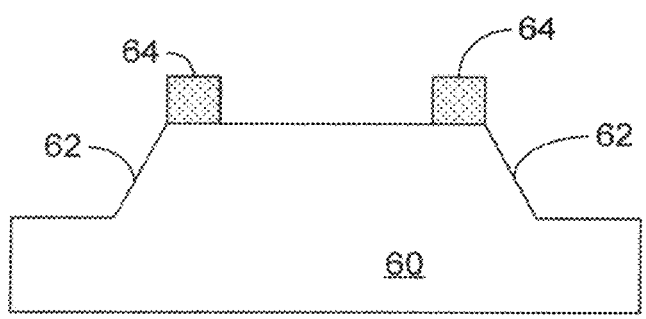
Figure 27:
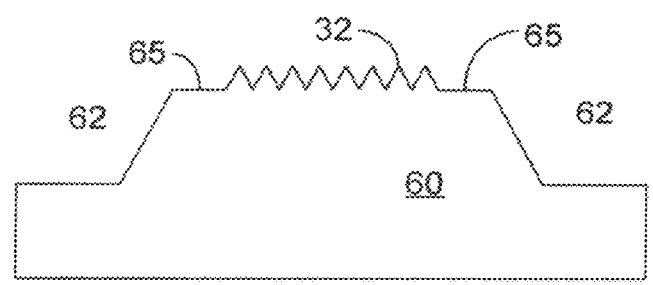

FIGS. 24 through 27 schematically illustrate the production of a mesa with both planar and chemically developed features on its face. In FIG. 24 the gallium nitride crystal is again designated at 60 and is illustrated with an appropriate mask 64, examples of which are SiN, or commercially available polymer films that can otherwise withstand the wet etch. With the mask 64 in place, the progression from FIG. 24 to FIG. 25 schematically illustrates a wet etch that again produces the indexed crystal faces 62. In the progression from FIG. 25 to FIG. 26, portions of the mask 64 are removed (opened) to define the resulting featured surface 32; i.e. after the second wet etch is conducted in the progression from FIG. 26 to FIG. 27. This produces a mesa with the indexed sidewalls 62, some planer facial portions 65 (typically a perimeter, but not necessarily exclusively so) and the crystal features 32 that are the same as the identically numbered features in, for example, FIG. 1 or those labeled at 53 in FIGS. 5-7, 9 and 10.

Both of these respective sequences produce a two-part sidewall with a first major portion (i.e., more than incidental) along an indexed plane and a second major portion at an obtuse angle with respect to the first major portion.

In the drawings and specification there has been set forth a preferred embodiment of the invention, and although specific terms have been employed, they are used in a generic and descriptive sense only and not for purposes of limitation, the scope of the invention being defined in the claims.

We claim:

1. A light emitting diode comprising a Group III nitride light emitting active structure mesa comprising sidewalls produced using a wet chemical etch.

2. A light emitting diode according to claim 1, wherein the emitting face of said diode is a Group III nitride surface of said active structure.

3. A light emitting diode according to claim 1, further compromising a support structure for said mesa, said support structure being selected from the group consisting of metals, semiconductor substrates, and sub-mount structures.

4. A light emitting diode according to claim 1, wherein said light emitting active structure comprises at least one p-type layer of gallium nitride and at least one n-type layer of gallium nitride.

5. A light emitting diode according to claim 4, wherein said gallium nitride layers terminate in an indexed crystal plane edge of said mesa sidewalls.

6. A light emitting diode according to claim 1, wherein said mesa sidewalls are along the (hkil) crystal plane of gallium nitride.

7. A light emitting diode according to claim 1, wherein said mesa sidewalls are along the {10-11} family of crystal planes of hexagonal gallium nitride.

8. A light emitting diode according to claim 1 further comprising a mirror between said light emitting active structure and said support structure.

9. A plurality of light emitting diodes according to claim 1 on a common wafer.

10. A light emitting diode according to claim 1 further comprising a roughened surface formed of a plurality of crystallographic features that demonstrate indexed planes of the Group III nitride.

11. A light emitting diode according to claim 10, wherein said indexed planes of said roughened surface are congruent with an indexed crystal plane of said mesa sidewall.

12. A light emitting diode according to claim 3, comprising an ohmic contact to said support structure and an ohmic contact to said active structure.

13. A light emitting diode according to claim 10 comprising an ohmic contact to said roughened surface.

14. A light emitting diode according to claim 3, wherein said sidewalls form an angle of between approximately 58 and 62 degrees with respect to said support structure.

15. A light emitting diode according to claim 1, wherein said chemically developed sidewalls have been treated by an anisotropic wet etch.

16. A light emitting diode according to claim 15, wherein said anisotropic wet etch is from a group which includes potassium hydroxide, sodium hydroxide, potassium hexacyanoferrate, and combinations thereof.

17. A light emitting diode according to claim 1 further comprising said Group III nitride light emitting active structure mesa having a chemically developed surface.

18. A light emitting diode according to claim 17, further comprising at least a portion of said chemically developed surface dry etched.

* * * * *